(12) United States Patent
Sandow et al.

(10) Patent No.: US 9,166,027 B2
(45) Date of Patent: Oct. 20, 2015

(54) IGBT WITH REDUCED FEEDBACK CAPACITANCE

(71) Applicant: Infineon Technologies AG, Neubiberg (DE)

(72) Inventors: Christian Philipp Sandow, Haar (DE); Hans-Joachim Schulze, Taufkirchen (DE); Johannes Georg Laven, Taufkirchen (DE); Franz-Josef Niedernostheide, Hagen a.T.W. (DE); Frank Pfirsch, Munich (DE); Hans-Peter Felsl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/041,094

(22) Filed: Sep. 30, 2013

(65) Prior Publication Data

US 2015/0091053 A1    Apr. 2, 2015

(51) Int. Cl.
*H01L 29/739*    (2006.01)

(52) U.S. Cl.
CPC .................................. *H01L 29/7393* (2013.01)

(58) Field of Classification Search
CPC ................................................... H01L 29/7393
USPC ......................................................... 257/139
See application file for complete search history.

(56) References Cited

U.S. PATENT DOCUMENTS

| 5,283,201 | A | 2/1994 | Tsang et al. | |
|---|---|---|---|---|
| 2009/0289690 | A1 | 11/2009 | Hirler et al. | |
| 2012/0217540 | A1* | 8/2012 | Hirler | 257/133 |
| 2012/0286323 | A1* | 11/2012 | Werber | 257/139 |
| 2013/0075814 | A1* | 3/2013 | Meiser et al. | 257/334 |
| 2013/0092977 | A1* | 4/2013 | Huesken et al. | 257/139 |
| 2013/0187196 | A1* | 7/2013 | Kadow | 257/140 |

FOREIGN PATENT DOCUMENTS

DE    10085054 B4    12/2005

* cited by examiner

*Primary Examiner* — Walter H Swanson
(74) *Attorney, Agent, or Firm* — Murphy, Bilak & Homiller, PLLC

(57) ABSTRACT

An IGBT includes at least one first type transistor cell, including a base region, a first emitter region, a body region, and a second emitter region. The body region is arranged between the first emitter region and the base region. The base region is arranged between the body region and the second emitter region. The IGBT further includes a gate electrode adjacent the body region and dielectrically insulated from the body region by a gate dielectric, and a base electrode adjacent the base region and dielectrically insulated from the base region by a base electrode dielectric. The base region has a first base region section adjoining the base electrode dielectric and a second base region section arranged between the second emitter region and the first base region section. A doping concentration of the first base region section is higher than a doping concentration of the second base region section.

27 Claims, 5 Drawing Sheets

IGBT WITH REDUCED FEEDBACK CAPACITANCE

TECHNICAL FIELD

Embodiments of the present invention relate to an IGBT.

BACKGROUND

An IGBT is a bipolar transistor device that can be used as an electronic switch for switching an electrical load. An IGBT can be implemented with a voltage blocking capability of up to several kilovolts (kV).

An IGBT includes a gate electrode adjacent a body region and dielectrically insulated from the body region by a gate dielectric. The body region of a second doping type separates a first emitter region (source region) of a first doping type from a base region (drift region). The IGBT further includes a second emitter region (drain region) of a second doping type complementary to the first doping type. In an on-state of the IGBT, the gate electrode generates a conducting channel in the body region along the gate dielectric so that the first emitter region injects charge carriers of a first type through the conducting channel into the base region, and the second emitter region injects charge carriers of a second type into the base region. The charge carriers of the first type and the second type form a charge carrier plasma in the base region. This charge carrier plasma results in a relatively low on-resistance of the IGBT. For example, in the on-state the voltage between a first emitter terminal and a second emitter terminal of an IGBT with a voltage blocking capability of about 1200V is only between 1V and 3V.

When the IGBT switches from the on-state to an off-state, the gate electrode interrupts the conducting channel in the body region. This allows an electrical potential of the second emitter region to increase relative to an electrical potential of the first emitter region. However, as the electrical potential of the second emitter region increases, a capacitance (often referred to as feedback capacitance) between the gate electrode and the second emitter region (which corresponds to a capacitance between the gate electrode and the base emitter region) may cause the gate electrode to be charged such that the IGBT again switches on in an undesired way.

There is therefore a need to provide an IGBT with a reduced feedback capacitance.

SUMMARY

One embodiment relates to an IGBT. The IGBT includes a base region, a first emitter region, a body region, and a second emitter region, wherein the body region is arranged between the first emitter region and the base region, and wherein the base region is arranged between body region and the second emitter region. The IGBT further includes a gate electrode adjacent the body region, and dielectrically insulated from the body region by a gate dielectric, and a base electrode adjacent the base region, and dielectrically insulated from the base region by a base electrode dielectric. The base region has a first base region section adjoining the base electrode dielectric, and a second base region section arranged between the second emitter region and the first base region section. A doping concentration of the first base region section is higher than a doping concentration of the second base region section.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
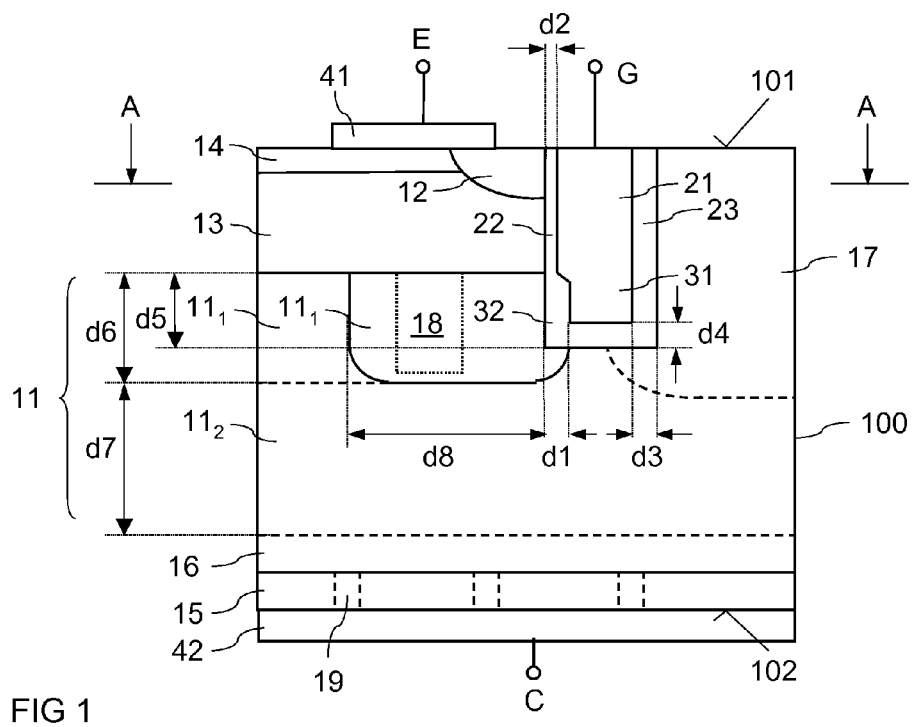
FIG. 1 illustrates a vertical cross sectional view of an IGBT according to one embodiment.

FIG. 1 illustrates a vertical cross sectional view of an IGBT according to one embodiment. The IGBT includes a semiconductor body 100 with a first surface 101, and a second surface 102 opposite the first surface 101. FIG. 1 shows a section of the IGBT in a vertical section plane that is perpendicular to the first and second surfaces 101, 102.

Referring to FIG. 1, the IGBT includes a base region 11 (which can also be referred to as drift region), a first emitter region 12 (which can also be referred to as source region), a body region 13, and a second emitter region 15 (which can also be referred to as drain region). The body region 13 is arranged between the first emitter region 12 and the base region 11 in the semiconductor body 100, and the base region 11 is arranged between the body region 13 and the second emitter region 15. Optionally, a field stop region 16 of the same doping type as the base region 11, but more highly doped than the base region 11, is arranged between the base region 11 and the second emitter region 15. The second emitter region 15 is electrically connected to an electrode 42. This electrode forms a collector terminal or is coupled to a collector terminal C of the IGBT. Optionally, the IGBT includes at least one third emitter region 19 of a doping type (conductivity type) complementary to the doping type of the second emitter region 15. The at least one third emitter region 19 is coupled between the collector electrode 42 and one of the drift region 11, and the field-stop region 16. That is, the at least one third emitter region is electrically connected in parallel with the second emitter region 15. An IGBT including the third emitter region 19 is a reverse conducting (RC) IGBT, as it may conduct a current independent of a voltage applied to the gate electrode 21 when the voltage between an emitter terminal E (explained below) and the collector terminal C has a certain polarity (is a positive voltage when the IGBT is an n-type IGBT).

A gate electrode 21 is arranged adjacent the body region 13, and is dielectrically insulated from the body region 13 by a gate dielectric 22. The IGBT further includes a base electrode 31 that is arranged adjacent the base region 11, and is dielectrically insulated from the base region 11 by a base electrode dielectric 32. In the embodiment shown in FIG. 1, the gate electrode 21 is implemented as a trench electrode that is arranged in a trench that extends into the semiconductor body 100 from the first surface 101. The base electrode 31 is located in the same trench as the gate electrode 21 and, as seen from the first surface 101, is arranged below the gate electrode 21, and adjacent the drift region 11. However, implementing the gate electrode 21 and the base electrode 31 as trench electrodes is only one example. It is also possible, to implement the gate electrode 21 and the base electrode 31 as planar electrodes above the first surface 101. In this case, a section of the drift region 11 extends to the first surface 101 of the semiconductor body 100.

Referring to FIG. 1, a position of a pn-junction between the body region 13 and the drift region substantially corresponds to the position of a lower end of the gate electrode 21. However, the pn-junction could also be arranged slightly above or below (such as +/−1 μm) the lower end of the gate electrode 22. That is, the gate electrode 22 may overlap the drift region 11 (in particular the first drift region section $11_1$ explained below), or the base electrode 31 may overlap the body region 13.

The IGBT shown in FIG. 1 is a vertical IGBT. That is, a current flow direction of the IGBT (which is a direction in which a current flows in the on-state of the IGBT) substantially corresponds to a vertical direction of the semiconductor body 100 (which is a direction perpendicular to the first surface 101). In this case, the source region 12 is arranged in a region of the first surface 101 of the semiconductor body 100, and the second emitter region 15 is arranged in the region of the second surface 102.

The first emitter region 12, and the body region 13 are electrically coupled to an electrode 41 that forms or is connected to an emitter terminal E of the IGBT, and the gate electrode 21 is coupled to a gate terminal G of the IGBT. In order to provide for an ohmic contact between the emitter electrode 41 and the body region 13, a higher doped contact region 14 of the same doping type as the body region 13, but more highly doped than the body region 13, may be arranged between the body region 13 and the emitter electrode 41.

The first emitter region 12 and the base region 11 have a first doping type, the body region 13, and the second emitter region 15 have a second doping type complementary to the first doping type.

Referring to FIG. 1, the base region 11 includes a first base region section $11_1$, and a second base region section $11_2$. The first base region section $11_1$ has a higher doping concentration than the second base region section $11_2$. According to one embodiment, a ratio $N11_1/N11_2$ between a maximum doping concentration of the first base region section $11_1$, and a maximum doping concentration of the second base region section $11_2$ is at least 10 ($N11_1/N11_2 \geq 10$). The first base region section $11_1$ adjoins the base electrode dielectric 32, and may adjoin the body region 13 (as illustrated). According to one embodiment, the first base region section $11_1$ extends to below a bottom of the trench in which the gate electrode 21 and the base electrode 31 are arranged. That is, the first base region section $11_1$ may extend deeper, as seen from the first surface 101, into the semiconductor body 100 than the trench with the gate electrode 21 and the base electrode 31.

According to one embodiment, the second base region section $11_2$ extends to the body region 13 next to the first base region section $11_1$. However, according to another embodiment (illustrated in dashed lines in FIG. 1) from the base region 11 only the first base region section $11_1$ adjoins the body region 13. That is, the second body region section $11_2$ is separated from the body region 13 by the first base region section $11_1$.

A doping concentration of the first base region section $11_1$ is, for example, between 1E14 cm$^{-3}$ and 1E17 cm$^{-3}$, in particular between 5E15 cm$^{-3}$ and 5E16 cm$^{-3}$. The doping concentration of the second base region section $11_2$ is, for example, between 1E13 cm$^{-3}$ and 1E16 cm$^{-3}$. The doping concentration of the first and second emitter regions 12, 15 is, for example, between 1E16 cm$^{-3}$ and 1E21 cm$^{-3}$, and the doping concentration of the body region 13 is, for example, between 1E17 cm$^{-3}$ and 1E19 cm$^{-3}$.

Referring to FIG. 1, the body region 13 may be arranged adjacent only one sidewall of the trench with the gate electrode 21 and the base electrode 31, while the drift region 11 is adjacent the sidewall opposite the body region 13. Optionally, a floating semiconductor region 17 of a doping type complementary to the base region 11 is adjacent the sidewall opposite the body region 13. This floating semiconductor region 17 may extend from the first surface 101 to below the bottom of the trench (as illustrated in dashed lines in FIG. 1).

In the embodiment shown in FIG. 1, the base electrode 31 is electrically connected to the gate electrode 21. Specifically, the gate electrode 21 and the base electrode 31 can be implemented as one electrode, wherein a first (upper) section of this electrode that is adjacent the body region 13 forms the gate electrode 21, and a second (lower) section of this electrode that is adjacent the base region 11 forms the base electrode 31. According to one embodiment, this electrode includes at least one of a metal and a polycrystalline semiconductor material, such as doped or non-doped polysilicon.

In FIG. 1, d1 denotes a thickness d1 of the base electrode dielectric 32, and d2 denotes a thickness of the gate dielectric 22. According to one embodiment, the base electrode dielectric 32 is thicker than the gate dielectric 22 (d1>d2). According to one embodiment, a ratio d1/d2 between these two thicknesses is between 1.2 and 5, in particular between 1.5 and 5. In FIG. 1, d1 is the thickness of the base electrode dielectric 32 along a sidewall of the trench below the gate dielectric 22, and d4 denotes a thickness of the base electrode dielectric at the bottom of the trench. This thickness d4 at the bottom is thicker than the gate dielectric 22 and is at least 1.2 time the thickness d2 of the gate dielectric (d4≥1.2d2). The thickness d4 at the bottom may correspond to the first thickness d1 (d4=d1), or may be thicker (d4>d1). Further, d3 denotes a thickness of a dielectric layer 23 that dielectrically insulates the gate electrode 21 and the base electrode 31 from the drift region 11 or the optional floating region 17 at the trench sidewall opposite the body region. The thickness d3 of this dielectric layer 23 may correspond to the thickness d2 of the gate dielectric 22 or may be thicker (d3≥d2). It is also possible that thickness d3 of the dielectric layer 23 corresponds to the thickness of the base electrode dielectric (d3=d1), or is thicker (d3>d1).

The body region 13 and the base region 11 form a pn-junction. The trench with the gate electrode 21 and the base electrode 31 extends beyond this pn-junction into the base region 11, wherein the base electrode 31 is arranged in the trench below the pn-junction. In FIG. 1, d5 denotes a length of that trench section that extends beyond the pn-junction into the base region 11, and d6 denotes the dimension of the first base region section $11_1$ in that direction in which the trench extends into the base region 11. This direction will be referred to as current flow direction in the following, and corresponds to a vertical direction of the semiconductor body 100 in this embodiment. In the embodiment shown in FIG. 1, the trench has a substantially rectangular cross section. However, it is also possible that the trench, and therefore the bas electrode dielectric 32, has rounded corners in a region adjoining the drift region 11.

In the embodiment shown in FIG. 1, d5<d6. That is, the first base region section $11_1$ extends from the pn-junction to below a bottom of the trench. However, this is only an example. According to a further embodiment, d6=d5, or even d6<d5, wherein in the latter case the first base region section $11_1$ ends between the pn-junction and the bottom of the trench. According to one embodiment, d5 is about 2 micrometers (µm), and d6 is between about 1 micrometer and 4 micrometers.

A dimension d8 of the first base region section $11_1$ in a direction perpendicular to the sidewall of the trench is, for example, at least between 10 nanometers (nm) and 50 nanometers. However, referring to the explanation above, it is also possible for the first base region section $11_1$ to extend along the complete body region 13 in the direction perpendicular to the trench sidewall, so that the pn-junction between the body region 13 and the base region 11 is only formed between the body region 13 and first base region section $11_1$.

One way of operation of the IGBT illustrated in FIG. 1 is explained below. Just for the purpose of explanation it is assumed that the IGBT is an n-type device. That is, the first emitter region 12 and the base region 11 are n-doped, while the body region 13 and the second emitter region 15 are p-doped. Further it is assumed that the IGBT is an enhancement device. That is, the IGBT is only in the on-state when the gate electrode 21 generates an inversion channel in the body region 13 along the gate dielectric 22.

However, it is also possible to implement the IGBT as a p-type enhancement device, or as an n-type or p-type depletion device. In a depletion device, there is a channel region of the same doping type as the source region 12 along the gate dielectric 22 in the body region 13. This device is in the on-state when the gate-emitter voltage is zero, and can be switched off by applying an electrical potential to the gate electrode 21 such that the channel region is depleted of charge carrier. In an n-type IGBT the electrical potential that is to be applied to the gate electrode 21 in order to switch off the IGBT is negative relative to the electrical potential of the source region 12, and in a p-type IGBT this electrical potential is positive relative to the electrical potential of the source region 12.

Like a conventional IGBT, the IGBT shown in FIG. 1 can be switched on and off by applying a suitable drive potential to the gate electrode 21 via the gate terminal G. The IGBT is in an on-state when an electrical potential is applied to the gate electrode 21 that generates a conducting channel (an inversion channel in an enhancement IGBT) in the body region 13 between the first emitter region 12 and the base region 11. When, in the on-state, a (positive) voltage is applied between the collector and emitter terminals C, E, n-type charge carriers (electrons) are injected into the base region 11 through the inversion channel along the gate dielectric 22 and flow to the second emitter region 15, and p-type charge carriers (holes) are injected into the base region 11 by the second emitter region 15 and flow to the body region 13, and the emitter terminal E, respectively. The presence of p-type charge carriers and n-type charge carriers in the base region 11 results in a charge carrier plasma in the base region 11 that is responsible for low conduction losses of the IGBT.

In an n-type device, the electrical potential to be applied to the gate electrode 21 in order to switch on the IGBT is a positive potential relative to the electrical potential of the first emitter region 12, and the emitter terminal E, respectively. According to one embodiment, a gate-emitter voltage that switches on the IGBT is, for example, between about 10 V and 15 V.

When the IGBT switches off, that is when the conducting channel in the body region 13 is interrupted (for example, by setting the gate-emitter voltage to zero), and when there is still a positive voltage between the collector and emitter terminals C, E, a space charge region (depletion region) expands in the base region 11 beginning at the pn-junction between the body region 13 and the base region 11. In this operation mode, the electrical potential at the collector terminal C may increase relative to the electrical potentials at the gate and emitter terminals G, E. Referring to FIG. 1, the gate electrode 21 is capacitively coupled to the base region 11, and the second emitter region 15, respectively, through the base electrode dielectric 32 and the base electrode 31. However, by virtue of the relatively thick base electrode dielectric 32, this capacitive coupling is poorer than in a conventional IGBT in which the gate electrode 21 extends into the base region and is dielectrically insulated from the base region by the gate dielectric. This poorer capacitive coupling of the second emitter region 15 to the gate electrode is equivalent to a relatively low gate-emitter (gate-drain) capacitance, and helps to reduce the risk that an increase of the electrical potential at the collector terminal C may cause the gate electrode 21 to be capacitively charged such that the inversion channel in the body region 13 is again switched on.

Further, the relatively thick base electrode dielectric 32 that separates the base electrode 31 from the drift region 11 helps to reduce the risk of a dielectric breakdown of the base electrode dielectric 32 when the IGBT switches from the on-state to the off-state.

In the on-state of the IGBT, there is an accumulation channel in the base region 11 along the base electrode dielectric 32. This accumulation channel provides a low-ohmic current path for charge carriers in the base region 11 along the base electrode dielectric 32, and therefore helps to reduce the electrical resistance (the voltage between the emitter and collector terminals E, C) of the IGBT in the on-state. However, due to the relatively thick base electrode dielectric 32 this accumulation channel is weaker (a charge carrier concentration along the base electrode dielectric 32 is lower) than in a conventional IGBT in which the gate electrode extends into the base region and is dielectrically insulated from the base region by the gate dielectric.

In order to compensate for this weaker accumulation channel the base region 11 of the IGBT shown in FIG. 1 includes the higher doped first base region section $11_1$ along the base electrode dielectric 32 and adjoining the body region 13. When, however, a doping concentration of this first base region section $11_1$ is too high, the voltage blocking capability of the IGBT may decrease. Thus, at a given thickness of the base electrode dielectric 32, there is a tradeoff between the on-resistance and the voltage blocking capability of the IGBT. That is, the on-resistance can be reduced by increasing the doping concentration of the first base region section $11_1$, wherein this increase of the doping concentration may result in a reduced voltage blocking capability.

Referring to the explanation above, the on-resistance (the saturation voltage between the collector and emitter terminals C, E) of the IGBT decreases as the doping concentration of the first base region section $11_1$ increases. However, the voltage blocking capability may decrease as the doping concentration of the first base region section $11_1$ increases. Thus, there is a doping level of the first base region section $11_1$ that results in a reduced on-resistance (as compared to the case in which the first and second base region sections $11_1$, $11_2$ have the same doping concentrations), but in which there is no significant decrease of the voltage blocking capability. This is explained with reference to two examples below that have been based on simulations.

A first example, that will be referred to as reference in the following, relates to a conventional IGBT that has a topology similar to the topology shown in FIG. 1, but is different from the topology shown in FIG. 1 in that the base region has a substantially homogeneous doping concentration (that is, a doping concentration of the first base region section $11_1$ corresponds a doping concentration of the second base region section $11_2$), and in that the gate electrode 21 extends into the base region 11 and is dielectrically insulated from the base region by the gate dielectric (this is equivalent to having d1=d2 in the embodiment shown in FIG. 1). Parameters of the reference device are:

$N11_1 = N11_2 = 1E14$ cm$^{-3}$
d1=d2=100 nm
$V_{CEsat}$=1.40 V
Maximum electric field strengths at the bottom of the trench: 410 kV/cm
$V_{CEmax}$=1150 V
d6=2 µm (micrometer)
d7=90 µm.

$V_{CEmax}$ is the voltage blocking capability, and $V_{CEsat}$ is the voltage between the collector and emitter terminals C, E of the IGBT in the on-state when a current in accordance with the current rating flows through the IGBT. Dimension d7 is the length of the second drift region section $11_2$ in the current flow direction, which is the shortest distance between the first drift region section $11_1$ and the second emitter region 15 or the field-stop region 16, respectively.

Referring to the explanation herein above, the gate-emitter (gate-drain) capacitance, and a maximum electric-field strength at the bottom of the trench appearing during the turn-off phase can be reduced by making the base electrode dielectric 32 thicker than the gate dielectric 22. In this embodiment:

d1=3.5*d2
$N11_1 = 100*N11_2$

That is, the base electrode dielectric 32 has a thickness d1 that is 3.5 times a thickness d2 of the gate dielectric 22, and there is a first base region section $11_1$ that has a doping concentration that is 100 times a doping of the second base region section $11_2$. This device has the following electrical parameters:

$V_{CEsat}$=1.415 V
$V_{CEmax}$=1120 V
Maximum electrical field at the bottom of the trench: 380 kV/cm.

Thus, the base electrode dielectric 32 that is thicker than the gate dielectric 22 results in a reduced maximum electrical-field strength at the bottom of the trench. Further, this thicker base electrode dielectric 32 reduces the gate-emitter capacitance, which increases the switching speed of the IGBT and reduces the risk of the IGBT turning on during the switching-off process. An accumulation channel along the base electrode dielectric 32 is weaker than in the reference device. However, the first base region section $11_1$ that has a higher doping concentration than the second base region section $11_2$ widely compensates for this weaker accumulation channel.

That is, the saturation voltage of the device with the thicker base electrode dielectric 32 is only 15 mV higher than the saturation voltage of the reference device (1.415V as compared to 1.40V in the reference device), and the voltage blocking capability is not significantly reduced (1120 V as compared to 1150V in the reference device).

According to one embodiment (illustrated in dotted lines in FIG. 1) the IGBT further includes at least one compensation region of a doping type complementary to the doping type of the base region 11. The least one compensation region 18 is electrically coupled to the body region 13, or the emitter terminal E, respectively, extends deeper into the base region 11 than the body region 13, is spaced apart from the base electrode dielectric 32, and forms a pn-junction with the first base region section $11_1$. That is, the compensation region 18 adjoins sections of the first base region section $11_1$ in a direction perpendicular to the current flow direction of the IGBT. The at least one compensation region 18 may completely extend through the first base region section $11_1$ (not illustrated), or may end in a first base region section $11_1$ (as illustrated). In the off-state, when a space charge region expands in the first base region section $11_1$ beginning at the pn-junction between the body region 13 and the first base region section $11_1$, a space charge region (depletion region) also expands in the first base region section $11_1$ beginning at the pn-junction between the compensation region 18 and the first base region section $11_1$. Thus, dopant charges of the first base region section $11_1$ find corresponding counter charges in the compensation region 18. Thus, the compensation region 18 compensates at least a part of the doping charges in the first drift region section $11_1$ so that the higher doping concentration of the first base region section $11_1$ does not result in a decrease (or does not result in a significant decrease) of the voltage blocking capability. When a compensation region 18 is provided, the first base region section $11_1$ can even be doped higher than explained above.

Figure 2:
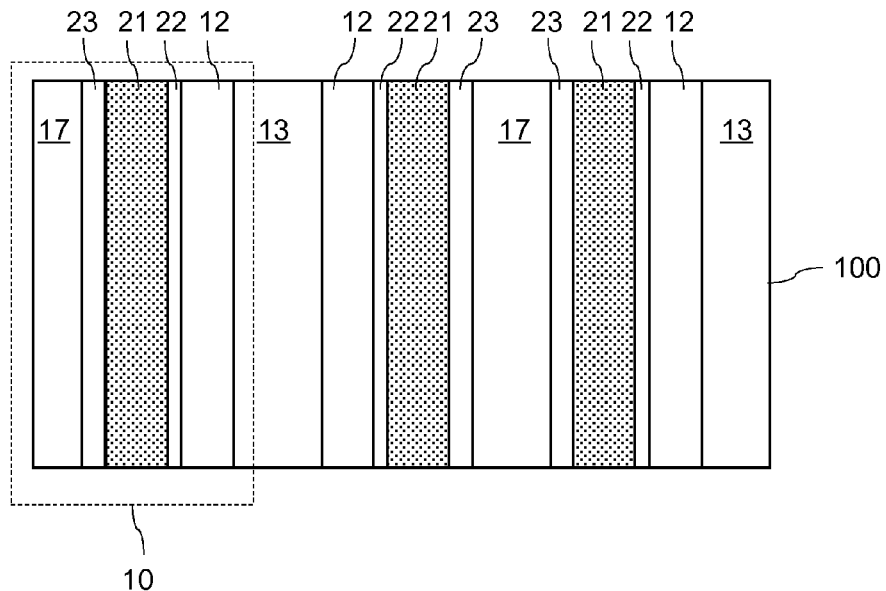
FIG. 2 illustrates a horizontal cross sectional view of an IGBT according to one embodiment.

FIG. 2 shows a horizontal cross sectional view of one embodiment of an IGBT that has vertical topology as illustrated in FIG. 1. FIG. 2 shows a horizontal cross section in a horizontal section plane A-A that goes through the body region 13, the source region 12, the gate dielectric 22, the gate electrode 21, the insulation layer 23, and the optional floating semiconductor region 17. The base electrode 31, which is below the gate electrode 21, and the base region 11 are not visible in this illustration. Referring to FIG. 2, the gate electrode 21, the gate dielectric 22, and the first emitter region 12 can be implemented as elongated device regions. Consequently, the optional floating region 17, the base electrode 31, and the base electrode dielectric 32 are also elongated device regions in this embodiment.

Referring to FIG. 2, the IGBT can be implemented with a plurality of device cells (transistor cells) 10, wherein each device cell includes one gate electrode 21, one gate dielectric 22, the insulation layer 23, one source region 12, one body region 13 (these regions are visible in FIG. 2), one base region section $11_1$ (not visible in FIG. 2), and one optional floating semiconductor region 17. The second base region section $11_2$, the optional field stop region 16, and the second emitter region 15 (not visible in FIG. 2) can be common to the individual device cells. The individual device cells are connected in parallel by having their source and body regions 12, 13 coupled to one common emitter terminal E, and by having the individual gate electrodes 21 electrically coupled to one common gate terminal G. FIG. 1 shows a vertical cross sectional view of one of those transistor cells.

Figure 3:
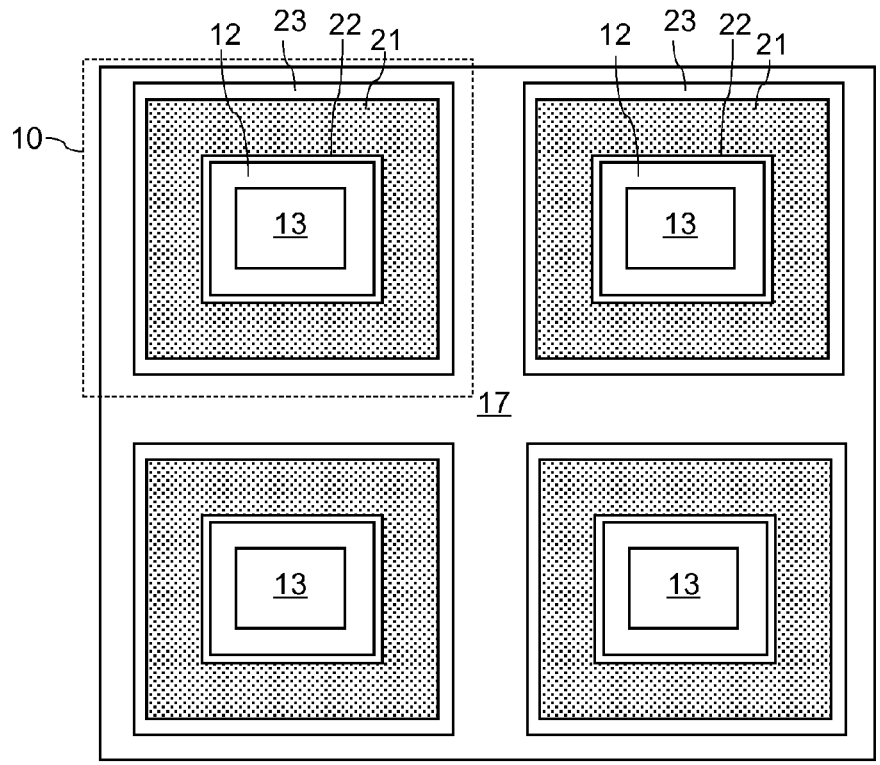
FIG. 3 illustrates a horizontal cross sectional view of an IGBT according to a further embodiment.

FIG. 3 shows a horizontal cross sectional view of a IGBT according to a further embodiment. In this embodiment, the gate electrode 21 is ring-shaped, wherein the gate dielectric 22 and the source and body regions 12, 13 are located inside the ring defined by the gate electrode 21. The insulation layer 23 and the optional floating semiconductor region 17 surround the ring defined by the gate electrode 21. Like in the embodiment illustrated in FIG. 2, the IGBT can be implemented with a plurality of transistor cells 10. In this embodiment, each transistor cell 10 includes a ring-shaped gate electrode 21, a gate dielectric 22, an insulation layer 23, a first emitter region 12, a body region 13, a base region 11, a second emitter region 15, an optional field-stop region 16, and an optional floating region 17. The vertical cross sectional view shown in FIG. 1 only shows one half of such transistor cell 10. Like in the embodiment explained with reference to FIG. 2, the individual transistor cells 10 are connected in parallel.

Figure 4:
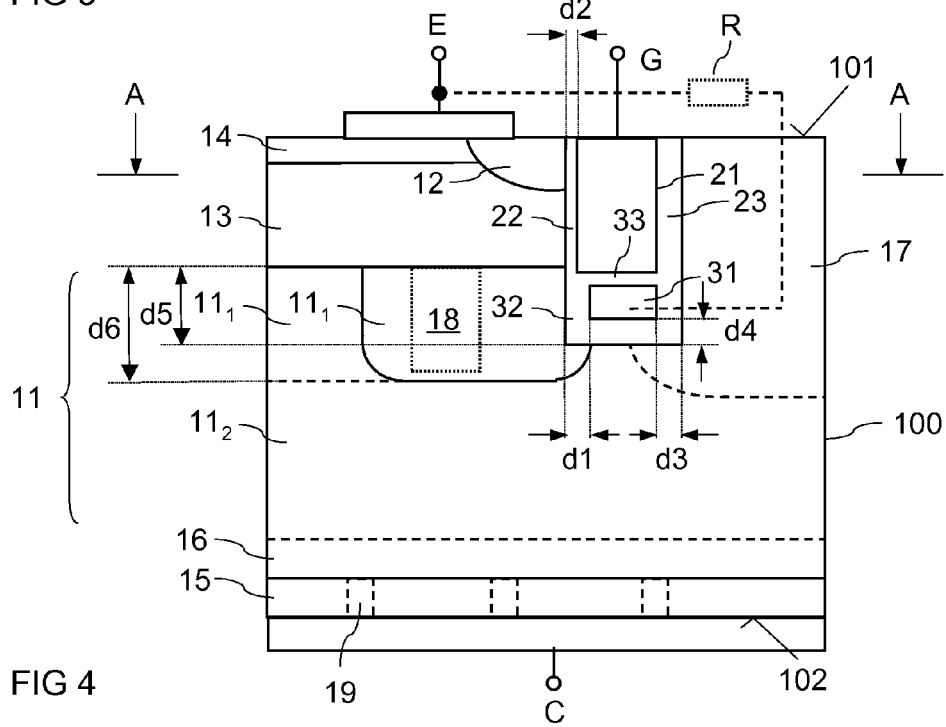
FIG. 4 illustrates a vertical cross sectional view of an IGBT according to one embodiment.

FIG. 4 shows a vertical cross sectional view of an IGBT according to a further embodiment. This embodiment is based on the embodiment shown in FIG. 1 so that the explanation provided in connection with FIG. 1 applies to the IGBT shown in FIG. 4 equivalently, except for those features that are explained in detail herein below.

In the embodiment shown in FIG. 4, the base electrode 31 is dielectrically insulated from the gate electrode 21 by a dielectric layer 33. According to one embodiment, the base electrode 31 is floating. In this case, the gate electrode 21, the dielectric layer 32, the floating base electrode 31, and the base electrode dielectric 33 form a capacitive voltage divider between the gate terminal G and the base region 11, and the collector terminal C, respectively. In this case, an electrical potential of the base electrode 31 is dependent on a voltage difference between the gate terminal G and the base region 11. A thickness of the dielectric layer 33 between the gate electrode 21 and the base electrode 31 is selected such that the dielectric layer 33 is capable of withstanding a voltage that may occur between the gate electrode 21 and the base electrode 31. According to one embodiment, a thickness of the dielectric layer 33 substantially corresponds to the thickness d2 of the gate dielectric 22, or is thicker. In this embodiment, the thickness d1 of the base electrode dielectric 32 may correspond to the thickness d2 of the gate dielectric 22 (d1=d2). According to another embodiment, the base electrode dielectric 32 is thicker than the gate dielectric 22 (d1>d2).

In the on-state of the IGBT shown in FIG. 4, a level of the electrical potential of the base electrode 31 is between a level of the electrical potential at the gate terminal G and a level of the electrical potential at the collector terminal C. If, for example, the gate-emitter voltage is 15 V, and the collector-emitter voltage $V_{CE}$ in the on-state is about 1.5 V, the voltage difference between the gate terminal G and the collector terminal C is about 13.5 V. The electrical potential of the base electrode 31 is then between 1.5 V and 15 V, wherein the voltage level is dependent on a capacitive coupling of the base electrode 31 to the gate electrode 21, and to the base region 11. If, for example, the dielectric layer 33 between the gate electrode 21 and the base electrode 31 is relatively thin as compared to the base electrode dielectric 32, then the electrical potential of the base electrode 31 is closer to the electrical potential of the gate electrode 21 than the electrical potential of the collector C. If, for example, the dielectric layer 33 is relatively thick as compared to the base electrode dielectric 32, then the electrical potential of the base electrode 31 in the on-state is closer to the electrical potential of the collector terminal C.

In the embodiment shown in FIG. 4, the floating base electrode 31, in the off-state of the IGBT, protects the gate electrode 21 from high electric-field strengths occurring at the bottom of the trench. This is true even in those embodiments, in which the base electrode dielectric 32 has a thickness that corresponds to a thickness of the gate dielectric 22 (d1=d2). In the on-state of the IGBT, an accumulation channel along the base electrode dielectric 32 may be relatively weak, because the electrical potential of the base electrode 31 is lower than the electrical potential of the gate electrode 21. In order to compensate for this, the IGBT shown in FIG. 4, like the IGBT shown in FIG. 1, includes a base region with a first base region section 11$_1$ that has a higher doping concentration than a second base region section 11$_2$.

In another embodiment (illustrated in dashed lines in FIG. 4) the base electrode 31 is electrically connected to the emitter electrode E. In this embodiment, there is no accumulation channel along the base electrode dielectric 32 when the IGBT is in the on-state, so that the base electrode 31 only serves to protect the gate electrode 21 from high electric-field strengths in the off-state of the IGBT. In this embodiment, a resistor R (shown in dotted lines in FIG. 4) may be connected between the base electrode 31 and the emitter terminal E.

According to another embodiment (not shown) the base electrode 31 is connected to a drive circuit that is configured to drive the base electrode 31 independent of the gate electrode 21. Referring to the explanation herein before, dependent on the electrical potential of the base electrode 31 there may be an accumulation channel in the drift region along the base electrode dielectric 32. According to one embodiment, the drive circuit is configured to control the base electrode 31 such that there is an accumulation channel along the base electrode dielectric 32 for most of the time when the transistor is in the on-state, i.e., when the gate electrode generates an inversion channel in the body region 13. In an n-type transistor, an accumulation channel along the base electrode dielectric 32 can be controlled by applying a drive potential to base electrode 31 that is higher than the source potential (that may correspond to the gate potential or be higher than the gate potential). However, the drive circuit is configured, a predefined time period before the gate electrode 21 switches off the inversion channel in the body region 13, to switch off the accumulation channel along the base electrode dielectric 32 in order to reduce the charge carrier concentration in the drift region 11.

Referring to the explanation herein before, the first base region section 11$_1$ counteracts a weak accumulation channel along the base electrode dielectric 32. That is, the first base region section 11$_1$ provides for a high concentration of free charge carriers in a region adjacent the base electrode 31 and the base electrode dielectric 32. However, there may be sections of the IGBT where a high concentration of free charge carriers is not desired. For example, in the edge region of a cell array with a plurality of transistor devices a high concentration of free charge carriers may be undesirable. An edge region of the cell array can be at an edge of the semiconductor body 100 which means e.g. in the area of the junction termination, or below or close to conductors, such as a gate pad. In those edge regions, transistor cells are usually omitted. According to one embodiment, the IGBT includes at least two different types of transistor cells, namely a first type of transistor cells corresponding to the transistor cells explained hereinbefore, and a second type of transistor cells that are implemented to have a lower concentration of charge carriers along the base electrode dielectric 32. These second type transistor cells are, for example, located in a transition region between a cell array that includes first type transistor cells and an edge termination structure, that may include field-rings or field-plates. The lateral extension of this transition region is, e.g., between 1 to 3 diffusion lengths of free charge carriers. According to one embodiment, there are several different second type transistor cells in this transition region, wherein the individual second type transistor cells are such that the concentration of free charge carriers in the second type transistor cells decreases towards the edge termination structure.

According to one embodiment, the second type of transistor cells corresponds to the first type of transistor cells explained hereinbefore with the difference that the first base region section $11_1$ of a second type transistor cell has a lower doping concentration than the first base region section $11_1$ of a first type transistor cell. Thus, in an embodiment where it is desired to decrease the concentration of free charge carriers in the second type transistor cells towards an edge termination structure, the doping concentration of the first base region section $11_1$ in the second type transistor cells decreases towards the edge termination structure.

According to one embodiment, the first base region section $11_1$ has the same doping concentration as the second base region section $11_2$. This is equivalent to not having higher doped first base region section $11_1$. That is, the base region 11 has a substantially homogeneous doping concentration corresponding to the doping concentration of the second base region section explained before.

Figure 5:
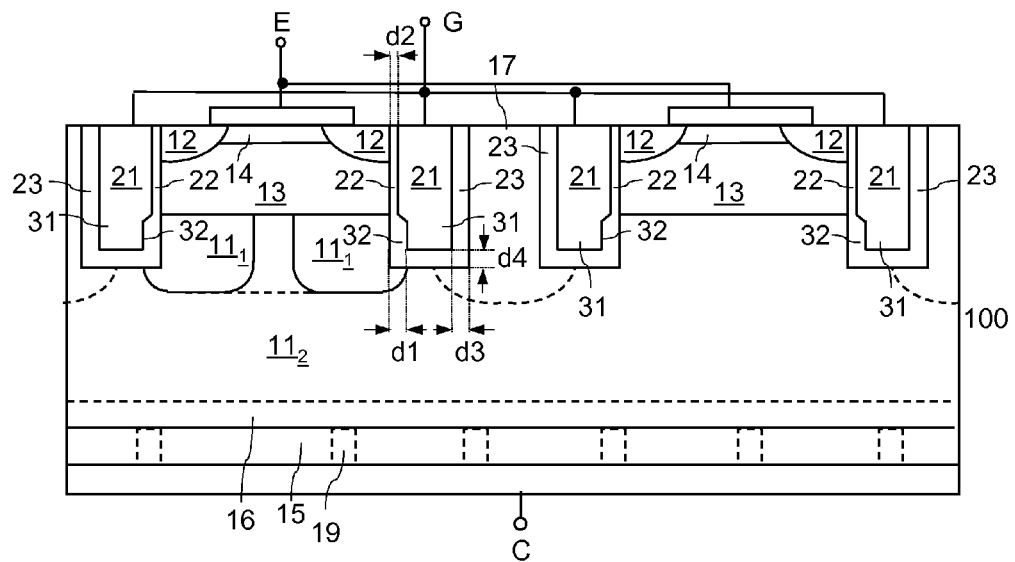
FIG. 5 illustrates one embodiment of an IGBT that is implemented with different types of transistor cells.

FIG. 5 shows a vertical cross sectional view of an IGBT that includes first type transistor cells corresponding to the transistor cells explained with reference to FIG. 1, and that includes second type transistor cells. The first type transistor cells are illustrated in the left section of FIG. 5, and the second type transistor cells are illustrated in the right section of FIG. 5. The second type transistor cells are based on the first type transistor cells but do not include the first base region section $11_1$. That is, in these transistor cells the base region 11 has the doping concentration of the second base region section $11_2$.

Figure 6:
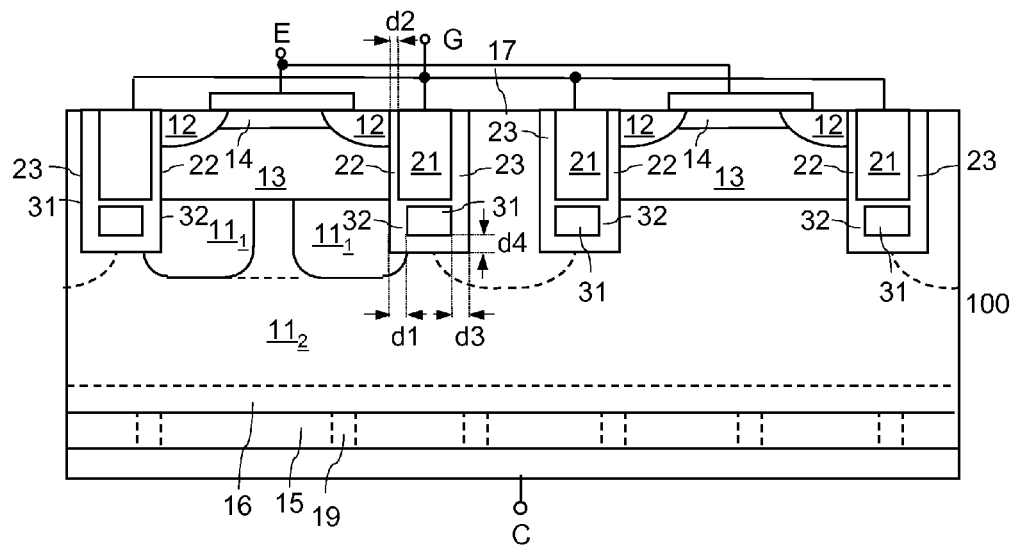
FIG. 6 illustrates another embodiment of an IGBT that is implemented with different types of transistor cells.

FIG. 6 shows a vertical cross sectional view of an IGBT with first type transistor cells and second type transistor cells according to another embodiment. In this embodiment, the first type transistor cells correspond to the transistor cell explained with reference to FIG. 4. These first type transistor cells are illustrated in the left section of FIG. 6. The second type transistor cells are based on the first type transistor cells with the difference that the first base region section $11_1$ is omitted.

According to yet another embodiment, an IGBT includes first type transistor cells corresponding to one of the transistor cells explained with reference to FIGS. 1 and 4, and third type transistor cells that provide for an even higher concentration of charge carriers along the base electrode dielectric 32 than the first type transistor cells. These third type transistor cells can be obtained from the first type transistor cells by one of reducing the thickness of the base electrode dielectric 32, and implementing the first base region section $11_1$ with a higher doping concentration.

Figure 7:
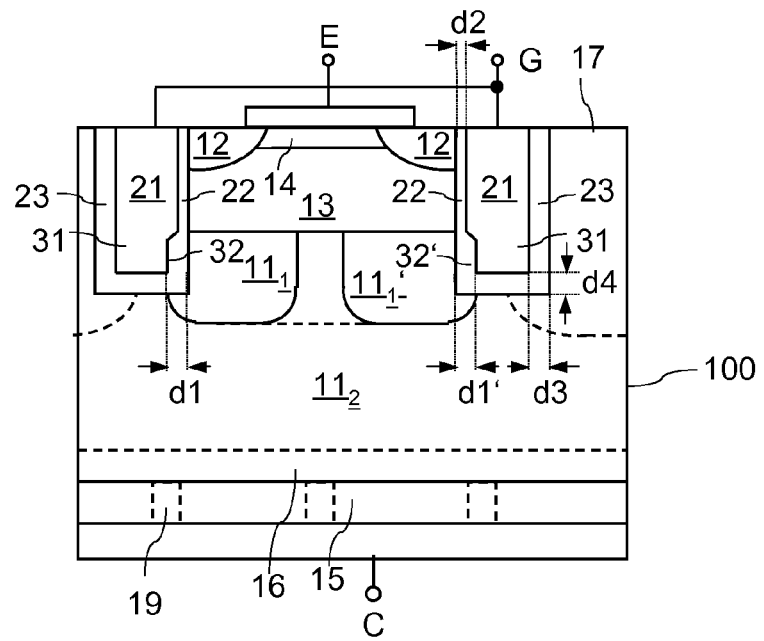
FIG. 7 illustrates another embodiment of an IGBT that is implemented with different types of transistor cells.

FIG. 7 shows a vertical cross sectional view of an IGBT that includes at least one first type transistor cell (illustrated in the left section of FIG. 7), and at least one third type transistor cell (illustrated in the right section of FIG. 7).

In this embodiment, the third type transistor cell has a base electrode dielectric 32 with a thickness d1', and a first base region section $11_1'$. According to one embodiment, at least one of the following applies: The base electrode dielectric 32' of the third type transistor cell is thinner than the base electrode dielectric 32 of the first type transistor cell (d1'<d1); and the first base region section $11_1'$ of the third type transistor cell has a higher doping concentration than the first base region section $11_1$ of the first type transistor cell ($N11_1'$>$N11_1$). According to one embodiment, $N11'/N11 \geq 2$, and $d1'/d1 \leq 0.5$. Thus, the thickness d1 is at least twice d1', and the doping concentration N11' is at least twice N11.

Figure 8:
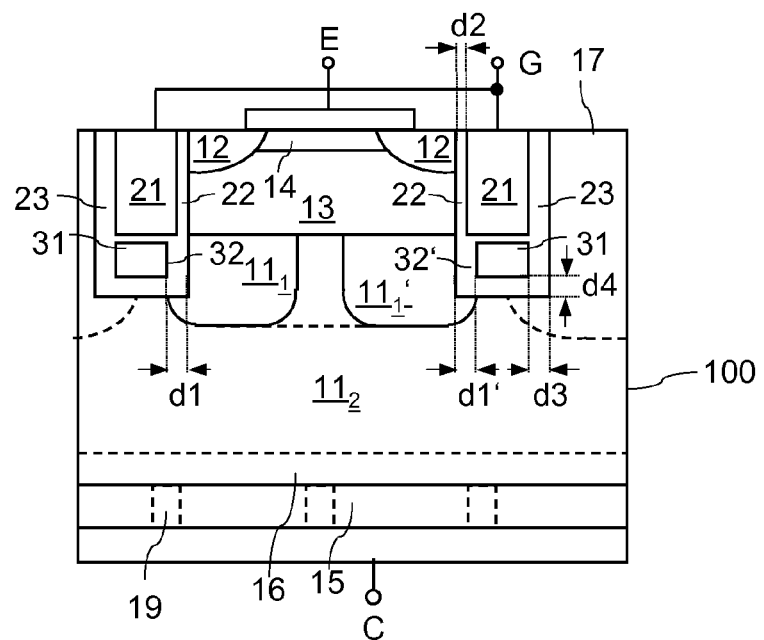
FIG. 8 illustrates yet another embodiment of an IGBT that is implemented with different types of transistor cells.

FIG. 8 shows a vertical cross sectional view of an IGBT that includes at least one first type transistor cell (illustrated in the left section of FIG. 8) that is based on the transistor cell shown in FIG. 4, and at least one third type transistor cell that is based on a first type transistor cell. Like in the embodiment shown in FIG. 7, at least one of the following applies: A base electrode dielectric 32' of the third type transistor cell is thinner than the base electrode dielectric 32 of the first type transistor cell (d1'<d1); and the first base region section $11_1'$ of the third type transistor cell has a higher doping concentration than the first base region section $11_1$ of the first type transistor cell.

The first base region section $11_1$ of the transistor cells explained herein before is a doped semiconductor region that is spaced apart from the first surface 101 of the semiconductor body 100. This (buried) semiconductor region can be produced in different ways. Some embodiments for implementing this buried semiconductor region $11_1$ are explained in the following.

Figure 9:
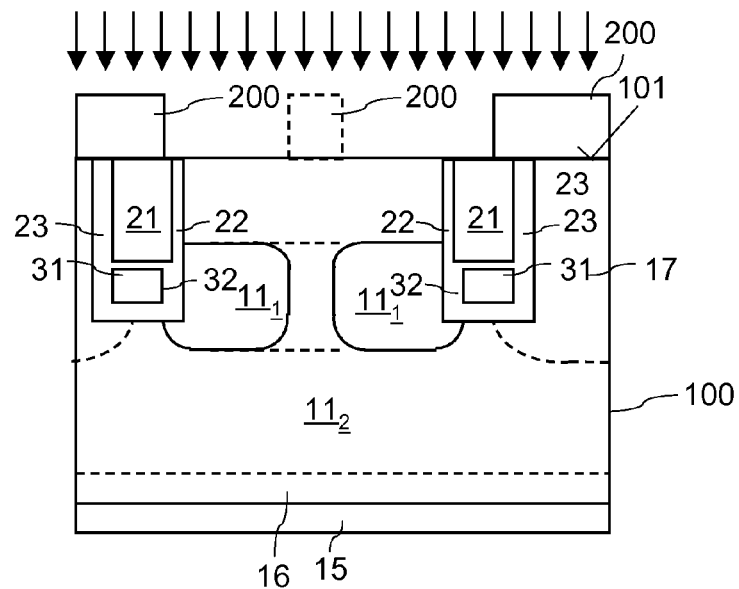
FIG. 9 illustrates one embodiment of a method for producing a buried semiconductor region in an IGBT.

FIG. 9 shows a vertical cross sectional view of the semiconductor body 100 during a method for producing the buried first base region section $11_1$ according to one embodiment. In this embodiment, the first base region section $11_1$ is produced after the gate electrode 21 with the gate dielectric 22, and the base electrode 31 with the base electrode dielectric 32 have been produced. Producing the first base region section $11_1$ includes at least one of an implantation and diffusion process. According to one embodiment, an implantation mask 200 is produced on the first surface 101, and dopant ions (or ions that may cause the generation of dopants by inducing the generation of defect-complexes, such as protons) are implanted into those sections of the first surface 101 uncovered by the mask 200. In the implantation process, an implantation energy is selected such that the dopant ions are introduced into those regions of the semiconductor body 100 where the first base region section $11_1$ is to be produced. The mask 200 covers at least those sections of the semiconductor body 100 where the optional floating region 17 has been produced (will be produced), and optionally covers those sections of the semiconductor body 100 where only the second base region section $11_2$ but not the first base region section $11_1$ is to be produced. This optional section of the mask 200 is illustrated in dashed lines in FIG. 9.

After the dopant atoms have been implanted, at least those sections of the semiconductor body 100 into which the dopant atoms have been implanted are annealed in order to activate the implanted dopant atoms. Suitable dopants are, for example, boron (B), phosphorous (P), selenium (Se), aluminum (Al), sulfur (S). Further, hydrogen or helium induced donors may be produced by implanting one of hydrogen and helium followed by an annealing process.

In an n-type IGBT, in which the base region 11 is n-doped, the first base region section $11_1$ can be produced by implanting protons into the semiconductor body 100, using the mask 200 for masking those regions into which an implantation of protons is not desired. This implantation process is followed by an annealing process in which the semiconductor body 100 is heated to temperatures of between 300° C. and 500° C., so as to form hydrogen induced donors.

According to yet another embodiment, fast diffusing dopant atoms, such as selenium or sulfur ions are implanted using the mask 200, and are then diffused deeper into the semiconductor body 100 using an annealing process.

The source region 12, the body region 13, and the body contact region 14 can be produced before or after the first base region section $11_1$ is produced. Producing these regions includes at least one of an implantation and diffusion process in which dopant atoms are introduced into the semiconductor body 100.

According to one embodiment, the semiconductor body 100 includes a semiconductor substrate that forms the second emitter region 15, and an epitaxial layer on a semiconductor substrate, wherein the epitaxial layer has a doping concentration corresponding to the doping concentration of the second base region section $11_2$. The source region 12, the body region 13, the body contact region 14, and the first base region section $11_1$ are then produced in this epitaxial layer. According to another embodiment, the semiconductor body 100 has a basic doping concentration corresponding to the doping concentration of the second base region section $11_2$. The second emitter region 15 and the optional field stop region 16 are then produced through at least one of an implantation and a diffusion process in which dopant atoms are introduced via the second surface 102 of the semiconductor body 100. The other device regions can be produced as explained hereinbefore.

Figure 10A:
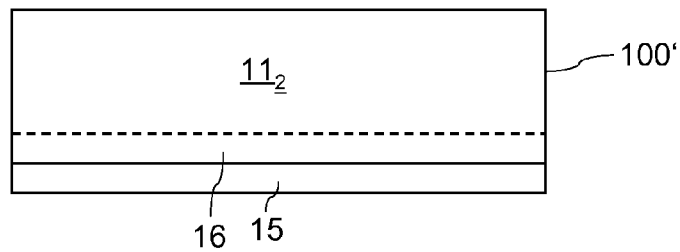
FIGS. 10A-10B illustrate another embodiment of a method for producing a buried semiconductor region in an IGBT.

Another embodiment of a method for producing the first base region section $11_1$ is explained with reference to FIGS. 10A and 10B below. Referring to FIG. 10A, the method includes providing a semiconductor body 100' that includes a first semiconductor layer forming the second emitter region 15, and a second semiconductor layer forming the second base region section $11_2$. According to one embodiment, the first semiconductor layer is a semiconductor substrate, and the second semiconductor layer is an epitaxial layer formed on the semiconductor substrate. In this process, the field-stop region 16 can be formed in the epitaxy process, so that the field-stop region 16 is a part of the epitaxial layer.

According to another embodiment, the semiconductor body 100' includes a semiconductor substrate that has a doping concentration corresponding to the doping of the second base region section $11_2$, wherein the second emitter region 15, and the optional field stop region 16 are produced by at least one of an implantation and a diffusion process.

Figure 10B:
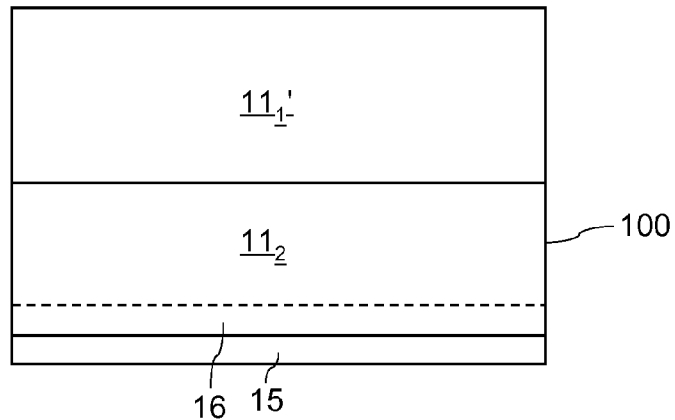

Referring to FIG. 10B, a third semiconductor layer is formed on a semiconductor body 100', so as to form the semiconductor body 100 explained hereinbefore. The third layer has a doping concentration corresponding to the doping concentration of the first base region section. This third layer is labeled with reference character $11_1'$ in FIG. 10B. In this third layer the body region 13, the body contact region 14, the source region 12, the gate electrode 21, the gate dielectric 22, the base electrode 31, and the base electrode dielectric 32 can be produced. Those regions of the third layer $11_1'$ that keep the basic doping concentration of this third layer $11_1'$ then form the first base region section $11_1$ of the IGBT. According to one embodiment, the third semiconductor layer $11_1'$ is an epitaxy layer.

According to yet another embodiment the first base region section $11_1$ is formed by implanting dopant ions into a lower sidewall section of the trench in which the gate electrode 21 and the base electrode 32 is formed.

The base electrode dielectric 32 and the dielectric layer 33 can be produced, for example, by means of thermal oxidation and/or by deposition of an oxide layer or by a combination of thermally generated oxide and one or more oxide deposition processes. The dielectric layers can also be produced by other dielectrics such as silicon nitride or dielectric stacks containing different dielectrics.

In the description hereinbefore, directional terminology, such as "top," "bottom," "front," "back," "leading," "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

It is to be understood that the features of the various embodiments described herein may be combined with each other, unless specifically noted otherwise.

What is claimed is:

1. An IGBT comprising at least one first type transistor cell, comprising: a base region, a first emitter region, a body region, and a second emitter region, wherein the body region is arranged between the first emitter region and the base region, and wherein the base region is arranged between the body region and the second emitter region;
   a gate electrode adjacent the body region, and dielectrically insulated from the body region by a gate dielectric; and
   a base electrode adjacent the base region, and dielectrically insulated from the base region by a base electrode dielectric,
   wherein the base region has a first base region section adjoining the base electrode dielectric and a second base region section arranged between the second emitter region and the first base region section, and wherein a doping concentration of the first base region section is higher than a doping concentration of the second base region section,
   the IGBT further comprising:
   at least one second type transistor cell comprising a first base region section with a lower doping concentration than the first base region section of the first type transistor cell.

2. The IGBT of claim 1, wherein the doping concentration of the first base region section of the at least one first type transistor cell is between $1E14$ $cm^{-3}$ and $1E17$ $cm^{-3}$, and wherein the doping concentration of the second base region section of the at least one first type transistor cell is between 1E13 cm$^{-3}$ and 1E16 cm$^{-3}$.

3. The IGBT of claim 1, wherein the doping concentration of the first base region section of the at least one first type transistor cell is between 5E15 cm$^{-3}$ and 5E16 cm$^{-3}$.

4. The IGBT of claim 1, wherein from the base region both the first base region section of the at least one first type transistor cell and the second base region section of the at least one first type transistor cell adjoin the body region.

5. The IGBT of claim 4, wherein a ratio between a thickness of the base electrode dielectric and a thickness of the gate dielectric is at least 1.2.

6. The IGBT of claim 1, wherein from the base region only the first base region section of the at least one first type transistor cell adjoins the body region.

7. The IGBT of claim 1, wherein the base electrode dielectric is thicker than the gate dielectric.

8. The IGBT of claim 1, wherein the gate electrode and the base electrode are arranged in a common trench of a semiconductor body.

9. The IGBT of claim 1, wherein an overlap of the base electrode with the base region is at least 0.5 micrometers.

10. The IGBT of claim 1, wherein the base electrode is electrically connected to the gate electrode.

11. The IGBT of claim 1, wherein the base electrode is floating.

12. The IGBT of claim 1, wherein the base electrode is electrically connected to an electrode connected to a source region of the first type transistor cell.

13. The IGBT of claim 1, further comprising:
a field stop region arranged between the base region and the second emitter region, the field stop region having a higher doping concentration than the base region.

14. The IGBT of claim 1, wherein the gate electrode is arranged in a trench of a semiconductor body, wherein the body region is adjacent one side of the trench, and wherein the gate electrode is insulated from a semiconductor region adjacent a second side of the trench by an insulation layer.

15. The IGBT of claim 14, wherein the semiconductor region adjacent the second side of the trench has a doping type that is complementary to a doping type of the base region.

16. The IGBT of claim 14, wherein the insulation layer is thicker than the gate dielectric.

17. The IGBT of claim 1, wherein the doping concentration of the first base region section of the second type transistor cell substantially corresponds to the doping concentration of the second base region section of the at least one first type transistor cell.

18. The IGBT of claim 1, further comprising:
a plurality of second type transistor cells, wherein the second type transistor cells have different doping concentrations of first drift region sections.

19. The IGBT of claim 18, wherein the plurality of second type transistor cells is arranged between a cell array with a plurality of first type transistor cells, and between an edge termination structure.

20. The IGBT of claim 1, wherein the at least one first type transistor cell and the second type transistor cell are connected in parallel.

21. The IGBT of claim 1, further comprising:
a third type transistor cell,
wherein at least one of:
a base electrode dielectric of the third type transistor cell is thinner than the base electrode dielectric of the at least one first type transistor cell; and
a first base region section of the third type transistor cell has a higher doping concentration than the first base region section of the at least one first type transistor cell.

22. The IGBT of claim 21, wherein the at least one first type transistor cell and the second type transistor cell are connected in parallel.

23. The IGBT of claim 1, further comprising:
a third emitter region of a doping type complementary to a doping type of the second emitter region and electrically coupled in parallel with the second emitter region.

24. The IGBT of claim 23, further comprising:
an electrode electrically connected to the second emitter region and the third emitter region.

25. The IGBT of claim 1, wherein the first emitter region and the base region are n-type semiconductor regions, and wherein the body region and the second emitter region are p-type semiconductor regions.

26. An IGBT comprising at least one first type transistor cell, comprising: a base region, a first emitter region, a body region, a second emitter region, and a third emitter region of a doping type complementary to a doping type of the second emitter region and electrically coupled in parallel with the second emitter region, wherein the body region is arranged between the first emitter region and the base region, and wherein the base region is arranged between the body region and the second emitter region;
a gate electrode adjacent the body region, and dielectrically insulated from the body region by a gate dielectric; and
a base electrode adjacent the base region, and dielectrically insulated from the base region by a base electrode dielectric,
wherein the base region has a first base region section adjoining the base electrode dielectric and a second base region section arranged between the second emitter region and the first base region section, and wherein a doping concentration of the first base region section is higher than a doping concentration of the second base region section.

27. The IGBT of claim 26, wherein the first emitter region and the base region are n-type semiconductor regions, and wherein the body region and the second emitter region are p-type semiconductor regions.

\* \* \* \* \*